United States Patent [19]

Buchy et al.

[11] 4,054,940

[45] Oct. 18, 1977

[54] THREE CONDUCTIVITY STATE CIRCUIT ELEMENT

[75] Inventors: Francois Buchy; Pierre Merenda; Jean Pierre D'Haenens, all of Paris, France

[73] Assignee: Thomson-CSF, Paris, France

[21] Appl. No.: 539,062

[22] Filed: Jan. 7, 1975

[30] Foreign Application Priority Data

Jan. 10, 1974 France ................................ 74.00811

[51] Int. Cl.[2] ........................ H01G 9/18; H01L 45/00; H01L 27/12

[52] U.S. Cl. ........................................ 361/435; 357/2; 357/4; 357/28; 338/22 R; 361/434

[58] Field of Search ................. 317/232; 357/4, 2, 28; 338/22

[56] References Cited

U.S. PATENT DOCUMENTS

| | | | |
|---|---|---|---|
| 1,863,253 | 6/1932 | Polin | 317/232 |
| 2,107,742 | 2/1938 | Ruben | 317/232 |
| 3,149,298 | 9/1964 | Handelman | 338/22 |
| 3,399,330 | 8/1968 | Vance | 317/232 |
| 3,588,638 | 6/1971 | Fleming | 357/2 |
| 3,614,480 | 10/1971 | Berglund | 357/2 |

FOREIGN PATENT DOCUMENTS

| | | | |
|---|---|---|---|
| 377,238 | 7/1932 | United Kingdom | 313/268 |

*Primary Examiner*—Andrew J. James

*Attorney, Agent, or Firm*—Cushman, Darby & Cushman

[57] ABSTRACT

A device possessing three conduction states comprises two electrodes connected with one another through the agency of a compound in the form $C_xH_y$ in which there are held in suspension particles of vanadium oxide, $VO_2$, the proportion by volume being of the order of 7%.

4 Claims, 8 Drawing Figures

THREE CONDUCTIVITY STATE CIRCUIT ELEMENT

The present invention relates to a device which can be triggered into three conduction states. In other words, this device can, under certain absolutely defined physical conditions, present three electrical resistances, namely a low resistance and one or the other of two high resistances.

The device in accordance with the invention comprises an enclosure equipped with two electrodes and containing particles in suspension in a binder. It is characterized essentially in that for a first, well defined temperature, the insulating particles become conductive, their concentration in the binder being sufficient to establish a conductive path from one electrode to the other; and in that for a second, well defined temperature, the binder exhibits a sudden variation in its coefficient of thermal expansion so that as a consequence the conductive path is broken.

The invention will be better understood from a consideration of the ensuing description given with reference to the attached drawings in which:

FIGS. 1, 2 and 3 respectively represent the device in accordance with the invention in its first state, its second state and its third state;

Figure 4:
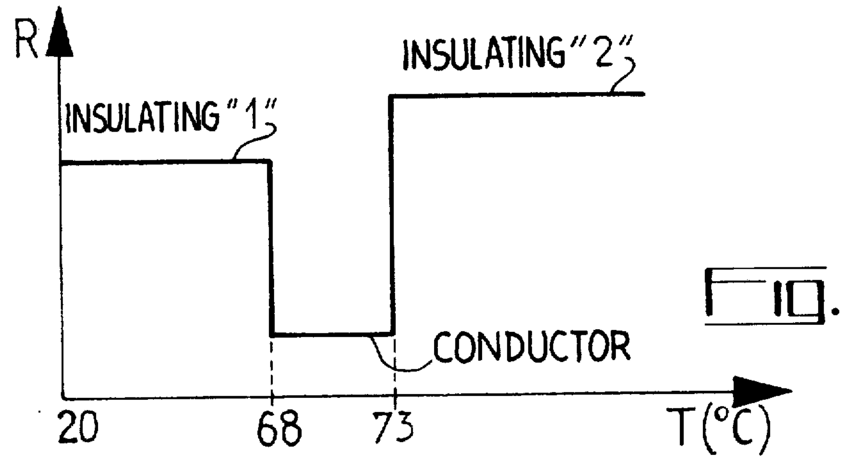
Figure 7:
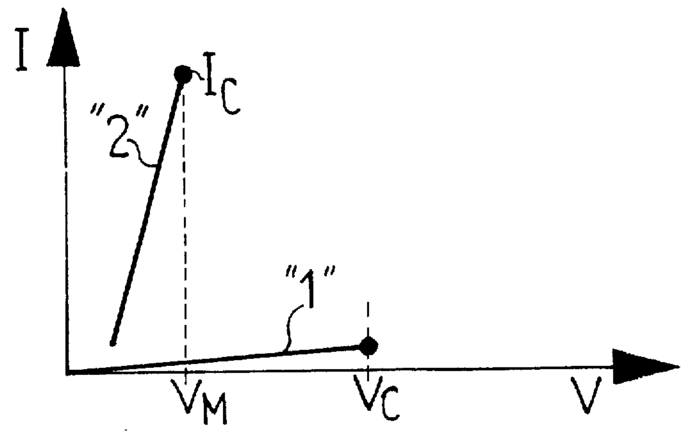

FIGS. 4 and 7 respectively illustrate the variations in resistance of an embodiment of the invention, as a function of the temperature in degrees centigrade, and the variations in the current as a function of the applied voltage in volts.

Figure 1:
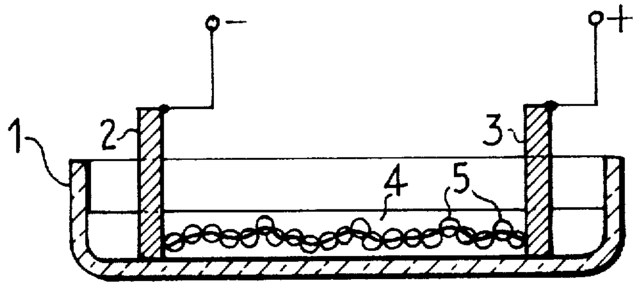

In FIG. 1, there has been illustrated a vessel 1 in which there are arranged two electrodes 2 and 3, one connected to the + pole and the other to the − pole, of a d. c. supply source, the latter being mentioned purely by way of example since the source could equally well supply alternating current.

This vessel contains a binder 4 in which, in suspension, there are contained particles 5 of a substance which has the property of acting as an insulator beneath a given temperature, and of changing from the insulating to the conductive state when said temperature is exceeded.

Vanadium oxide $VO_2$, for example at 68° C, experiences a change in conductivity from 10 ohm/cm to $10^{-4}$ohm/cm and, at this temperature, exhibits a sudden change from the properties of a dielectric to those of a metal. The binder has the property of possessing a coefficient of thermal expansion such that its volume increases suddenly by 20–30% at a given temperature. There are several substances which exhibit these properties.

FIG. 1 illustrates a high resistance conduction path linking the electrode 1 with the electrode 2, through the medium of contiguous particles 5.

This path, for example, exhibits a high resistance in the order of, for example, 100,000 ohms.

In FIG. 1, taking the case of vanadium oxide at68° C, it can be seen that its resistivity changes suddenly from 10 to $10^{-4}$ ohms/cm.

The conduction path experiences a sudden drop in resistance.

Figure 2:
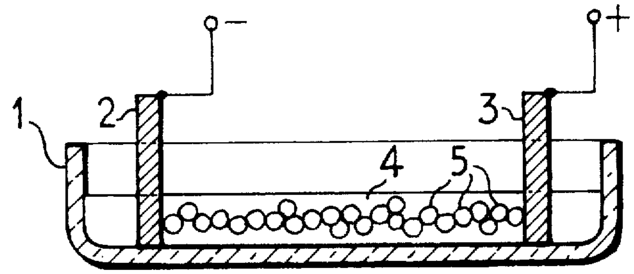

The assembly has been shown in FIG. 2 in its new state. A current develops between the two electrodes and the current tends to become substantial whilst the voltage between the two electrodes remains constant.

In the example chosen, the binder consists of $C_{36}H_{74}$. At 73° C, its volume increases suddenly by 22%. We then encounter the state shown in FIG. 3. The conductive path has broken. In the present example, the phenomena of conductivity, and disappearance of conductivity, occur for a volumetric concentration of 7% of $VO_2$ in the binder, the $VO_2$ particles having a diameter of the order of a micron.

Figure 3:
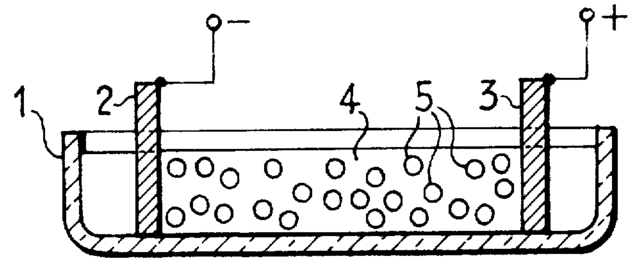

FIG. 4 illustrates the variations in the resistivity of the mixture of FIGS. 1–3 as a function of temperature.

From 0° to 68° C, the resistivity is constant and relatively high (insulating state "1", from 68° C to 73° C, the resistivity becomes very low and then at 73° C becomes very high again, the transitions from one state to another being extremely sharp, (conducting state "0").

In reality, the binder reaches its melting temperature at 73° C and changes from the crystalline to the amorphous state.

Figure 5:
FIGS. 5 and 6 show respectively in plan and in section a first example of an application.
Figure 6:
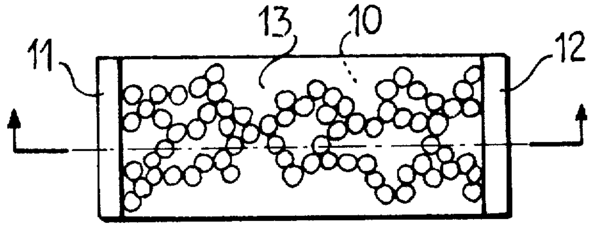

A device in accordance with the invention can be used as a three-state conductor device. In other words, it can be made to change from one conduction state to the others by simple variation of the voltage. The device illustrated respectively in section and in plan in FIGS. 5 and 6 comprises, deposited upon a substrate 10, two electrodes 11 and 12. By means of a brush, a mixture 13 in accordance with the invention is deposited between the two electrodes. The current flowing through the device as a function of the applied voltage, has been plotted in FIG. 7.

For $V < V_c$, a weak current flows, the device being a poor conductor in that state and the current flow becoming more and more filamentary. A first graph "1" is shown. For $V = V_c$, by virtue of the Joule effect, the temperature of the mixture has reached 68° C and the vanadium oxide becomes conductive.

The resistivity becomes low; the current becomes high for low values of V (curve 2).

For $V > V_M$, the temperature reaches 73° C and the binder expands. The conduction paths are broken. The conductivity and virtually equal to zero.

Figure 8:
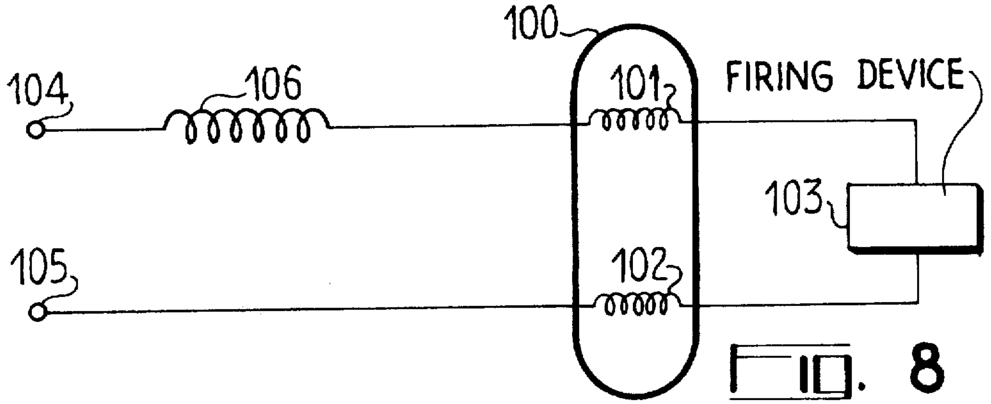
FIG. 8 is a second example of an application.

FIG. 8 illustrates an example of the application of the device illustrated in the preceding figures. This is a neon tube ignition circuit.

The circuit comprises a neon tube 100 with two filaments 101 and 102. These filaments are connected on the one hand to the two electrodes of a device in accordance with the invention, 103, and on the other to the two main terminals 104 and 105, one directly and the other across a coil 106.

The operation of the system is as follows :

At the time of starting, the device 103 is in the 1 state and conducts weakly. Then, the vanadium oxide becomes conductive and a heavy current flows through the filaments. The tube strikes and a conduction path is established between the two filaments through the medium of the neon plasma. This current is then maintained. Then, the device 103 ceases to conduct as a consequence of the change in state of the binder $C_{36}H_{74}$.

Self-evidently, many other circuits are conceivable, without departing from the scope of the invention.

What we claim is:

1. A three conduction state circuit element, comprising one input electrode and one output electrode and a pasted composite connecting these electrodes to each other a said composite being formed by particles in suspension in a binder, and said binder undergoing a sudden increase in volume, at a first well-defined temperature, said substance changing from the insulating to the conducting state at a second given temperature, lower than said first temperature.

2. An element as claimed in claim 1, wherein the binder has the chemical formula $C_{36}H_{74}$.

3. An element as claimed in claim 2, wherein the particles are particles of vanadium oxide.

4. An element as claimed in claim 3, wherein the particles of vanadium oxide occupy about 7% of the volume of the binder.

* * * * *